US005646880A

United States Patent [19]
Yuh

[11] Patent Number: 5,646,880
[45] Date of Patent: Jul. 8, 1997

[54] SEMICONDUCTOR MEMORY DEVICE FOR REDUCING OPERATING POWER CONSUMPTION AMOUNT

[75] Inventor: Jong Hak Yuh, Kyoungki-do, Rep. of Korea

[73] Assignee: Hyundai Electronics Industries Co., Ltd., Kyoungki-do, Rep. of Korea

[21] Appl. No.: 579,580

[22] Filed: Dec. 26, 1995

[30] Foreign Application Priority Data

Dec. 30, 1994 [KR] Rep. of Korea ............... 94-39222

[51] Int. Cl.$^6$ .................................................. G11C 11/24
[52] U.S. Cl. ................ 365/149; 365/205; 365/189.11; 365/189.09
[58] Field of Search .................. 365/205, 189.11, 365/149, 226, 203, 189.09

[56] References Cited

U.S. PATENT DOCUMENTS

| 5,373,477 | 12/1994 | Sigibayashi | 365/226 |
| 5,446,694 | 8/1995 | Tanaka et al. | 365/205 |

Primary Examiner—David C. Nelms
Assistant Examiner—Huan Hoang
Attorney, Agent, or Firm—Nath & Associates; Gary M. Nath

[57] ABSTRACT

A semiconductor memory device comprising a memory cell array connected to true and complementary bit lines, the memory cell array including a plurality of memory cells, a bit line sense amplifier for sensing and amplifying a small voltage difference between the true and complementary bit lines, a control signal generator for generating first and second control signals, a first pull-up driver for applying an external supply voltage to the bit line sense amplifier in response to the first control signal from the control signal generator, a second pull-up driver for applying an internal supply voltage to the bit line sense amplifier in response to the second control signal from the control signal generator, a pull-down driver for discharging a voltage from the bit line sense amplifier, a bit line precharge circuit for precharging the true and complementary bit lines, a switching circuit for transferring data on the true and complementary bit lines to true and complementary data bus lines in response to an output signal from a column decoder, respectively, and an internal supply voltage generator for generating the internal supply voltage and applying the generated internal supply voltage to the second pull-up driver.

4 Claims, 4 Drawing Sheets

स्5,646,880

SEMICONDUCTOR MEMORY DEVICE FOR REDUCING OPERATING POWER CONSUMPTION AMOUNT

BACKGROUND OF THE INVENTION

1. Field of the Invention

The present invention relates in general to semiconductor memory devices, and more particularly to a semiconductor memory device for reducing an operating power consumption amount in sensing and precharging bit lines.

2. Description of the Prior Art

Generally, the same supply voltage is used both in a bit line sensing circuit and in the peripheral circuit. For this reason, when the supply voltage is lowered to reduce bit line sensing power, the peripheral circuit is reduced in operation speed. On the contrary, in the case where the supply voltage is raised to enhance the operation speed of the peripheral circuit, operating current is increased, resulting in an increase in power consumption amount. Also, the increased operating current causes the generation of chip noise.

SUMMARY OF THE INVENTION

Therefore, the present invention has been made in view of the above problem, and it is an object of the present invention to provide a semiconductor memory device for setting data in a memory cell to a voltage level lower than that used in the peripheral circuit, so as to reduce an operating power consumption amount in sensing and precharging bit lines.

In accordance with the present invention, the above and other objects can be accomplished by a provision of a semiconductor memory device comprising a memory cell array connected to true and complementary bit lines, the memory cell array including a plurality of memory cells, each of the memory cells having a capacitor for storing charge therein and a MOS transistor for transferring the charge from the capacitor to the true bit line or the complementary bit line; bit line sense amplification means for sensing and amplifying a small voltage difference between the true and complementary bit lines; control signal generation means for generating first and second control signals; first pull-up drive means for applying an external supply voltage to the bit line sense amplification means in response to the first control signal from the control signal generation means; second pull-up drive means for applying an internal supply voltage to the bit line sense amplification means in response to the second control signal from the control signal generation means; pull-down drive means for discharging a voltage from the bit line sense amplification means; bit line precharge means for precharging the true and complementary bit lines; switching means for transferring data on the true and complementary bit lines to true and complementary data bus lines in response to an output signal from a column decoder, respectively; and internal supply voltage generation means for generating the internal supply voltage and applying the generated internal supply voltage to the second pull-up drive means.

The semiconductor memory device further comprises bit line precharge voltage generation means for generating a bit line precharge voltage and supplying the generated bit line precharge voltage to the bit line precharge means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
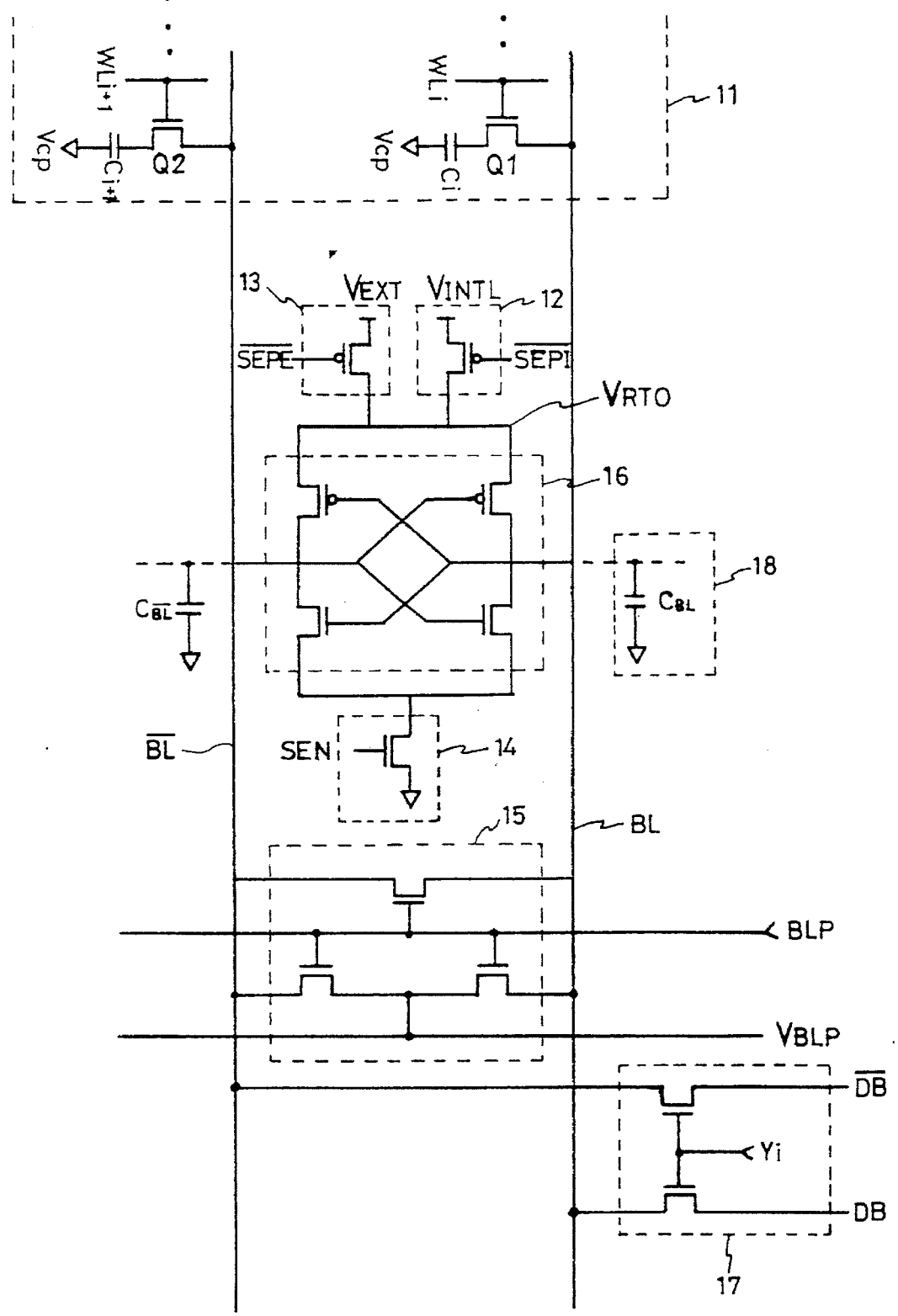
FIG. 1 is a circuit diagram of a semiconductor memory device to which the present invention is applied.

Referring to FIG. 1, there is shown a circuit diagram of a semiconductor memory device to which the present invention is applied. As shown in this drawing, the semiconductor memory device comprises a memory cell array 11 including a plurality of memory cells. Each of the memory cells has a capacitor for storing charge or information therein and a MOS transistor for transferring the information from the capacitor externally. The semiconductor memory device further comprises a bit line sense amplifier 16 for sensing and amplifying a small voltage difference between true and complementary bit lines BL and /BL connected to the memory cell array 11, pull-up drivers 12 and 13 and a pull-down driver 14 for driving the bit line sense amplifier 16, a bit line precharge circuit 15 for precharging the true and complementary bit lines BL and /BL, and a switching circuit 17 for transferring data on the true and complementary bit lines BL and /BL to true and complementary data bus lines DB and /DB in response to an output signal Yi from a column decoder (not shown), respectively.

The operation of the semiconductor memory device with the above-mentioned construction will hereinafter be described with reference to, for example, a read operation of a dynamic random access memory (referred to hereinafter as DRAM).

Figure 5:
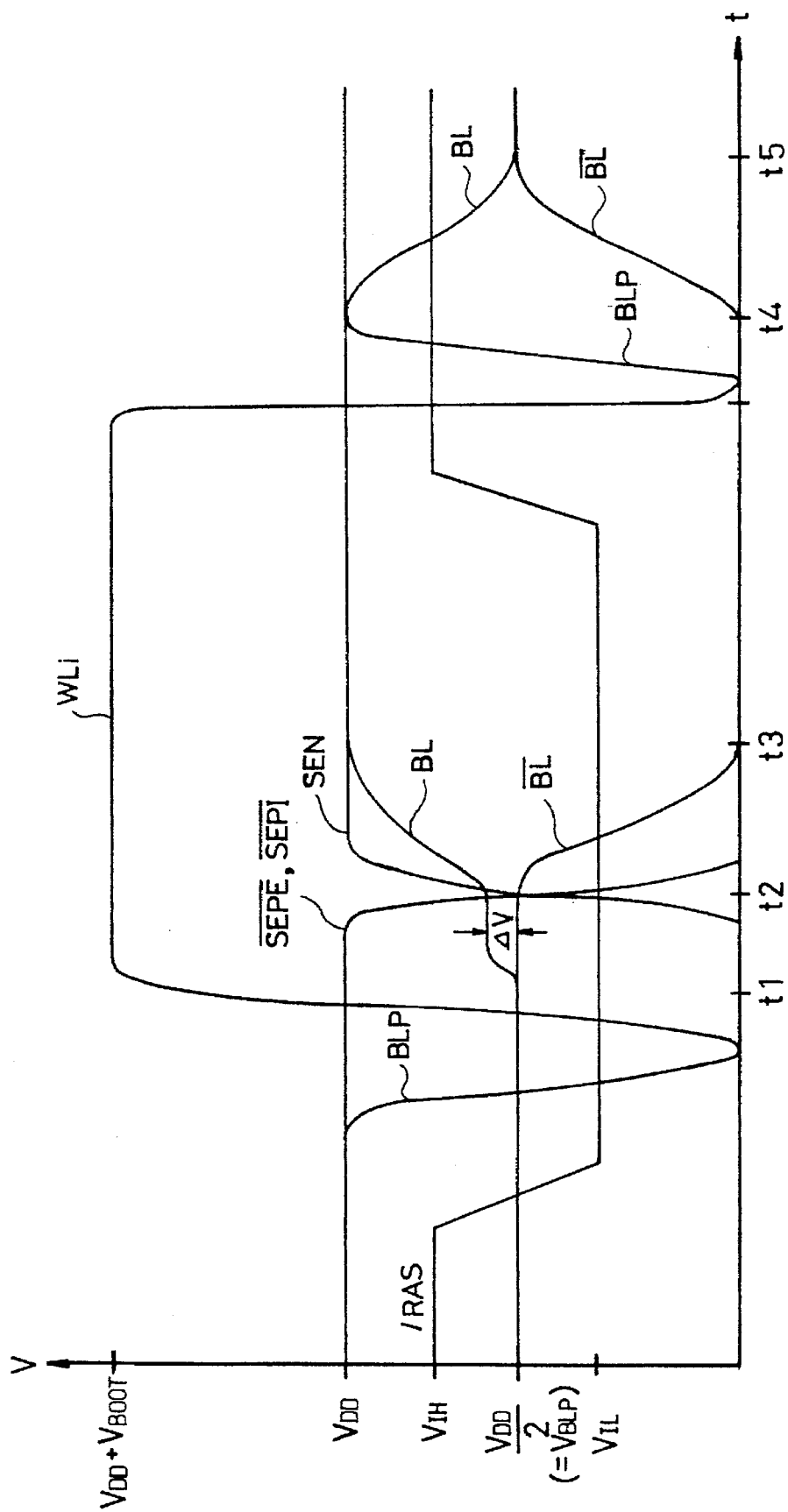
FIG. 5 is a timing diagram illustrating the operation of the semiconductor memory device in accordance with the present invention.

In FIG. 1, when a signal /RAS is low in logic, a word line WLi is bootstrapped to turn a MOS transistor Q1 on. As the MOS transistor Q1 is turned on, a capacitor Ci shares charge with a parasitic capacitance $C_{BL}$ of the true bit line BL. Because the true bit line BL is initially precharged with a bit line precharge voltage $V_{BLP}$, a voltage difference $\Delta V$ between the true and complementary bit lines BL and /BL after the charge sharing has a waveform as shown in FIG. 5. The voltage difference $\Delta V$ between the true and complementary bit lines BL and /BL can be expressed as follows:

$$\Delta V = [\{(C_i \times V_{INTL}) + (C_{BL} \times V_{BLP})\}/(C_i + C_{BL})] - V_{BLP}$$

For example, if $C_i \sim 30$ fF and $C_{BL} \sim 200$–$300$ fF, then $V_{BLP} \sim V_{INTL}/2$. In this case, $\Delta V \sim 100$–$200$ mV. In the case where control signals /SEPE and /SEP1 to the pull-up drivers 13 and 12 are made active low in logic and a control signal SEN to the pull-down driver 14 is made active high in logic at time t2 in FIG. 5, the bit line sense amplifier 16 performs a latch operation for data on the true and complementary bit lines BL and /BL to sense waveforms in an interval between time t2 and time t3 in FIG. 5.

When the signal /RAS goes from low $V_{IL}$ to high $V_{IH}$ in logic, a bit line precharge signal BLP in FIG. 1 goes from low to high in logic, the true and complementary bit lines BL and /BL are equalized with the bit line precharge voltage $V_{BLP}$. At this time, a consumption power amount in the bit line sensing and precharging operations can be calculated in the below manner.

First, the true bit line BL is charged from the bit line precharge voltage $V_{BLP}$ to an internal supply voltage $V_{INTL}$ in an interval between time t2 and time t3 in FIG. 5. The complementary bit line /BL is charged from a ground voltage Vss to the bit line precharge voltage $V_{BLP}$ in an interval between time t4 and time t5 in FIG. 5. Because $V_{BLP} \sim V_{INTL}/2$, a power amount consumed in the bit line sensing and precharging operations for one cycle of the signal /RAS is equal to that consumed in charging the true and complementary bit lines BL and /BL as mentioned above.

That is, $$I = (C \times V)/T$$
$$= \{(C_{BL} + C_{/BL}) \times (V_{INTL} - V_{BLF})\}/T$$

where, I is a consumption current amount, C is a load capacitance, V is a voltage variation of the load capacitance and T is one cycle of the signal /RAS.

Because $C_{BL} + C_{/BL} = 2C_{BL}$ and $V_{INTL} \sim 2V_{BLP}$, the above equation can briefly be expressed as follows:

$$I = (2C_{BL} \times V_{BLF})/T$$
$$= (C_{BL} \times V_{INTL})/T$$

For example, in the case where a 16M DRAM is operated at 1K refresh option, the consumption current amount can be calculated on the basis of the above equation as follows:

$$I=\{(200fF/BL \times 1024BL/WL \times 16WL) \times 3.3V\}/110ns \sim 90mA$$

In order to reduce the bit line sensing and precharging power, the parasitic capacitance $C_{BL}$ of the true bit line BL may be reduced, the cycle T may be lengthened, or the internal supply voltage $V_{INTL}$ may be lowered. However, the parasitic capacitance $C_{BL}$ of the bit line BL is a factor determined in the device manufacturing process and the cycle T is connected with the speed of DRAM. For this reason, it is difficult to vary the parasitic capacitance $C_{BL}$ of the bit line BL and the cycle T. In result, lowering the internal supply voltage $V_{INTL}$ must be applied in a proper manner to reduce the bit line sensing and precharging power. The reduced power amount is determined according to the ratio of the internal supply voltage $V_{INTL}$ for the sensing driver 12 to an internal supply voltage $V_{INT}$ for other circuits.

Figure 2A:
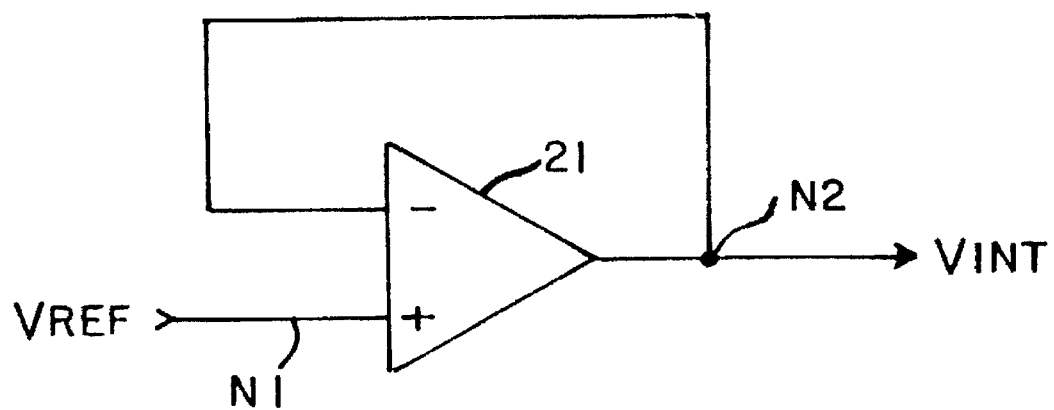
FIG. 2(a) and 2(b) are a circuit diagram of an internal supply voltage generator for the semiconductor memory device in accordance with the present invention.
Figure 2B:
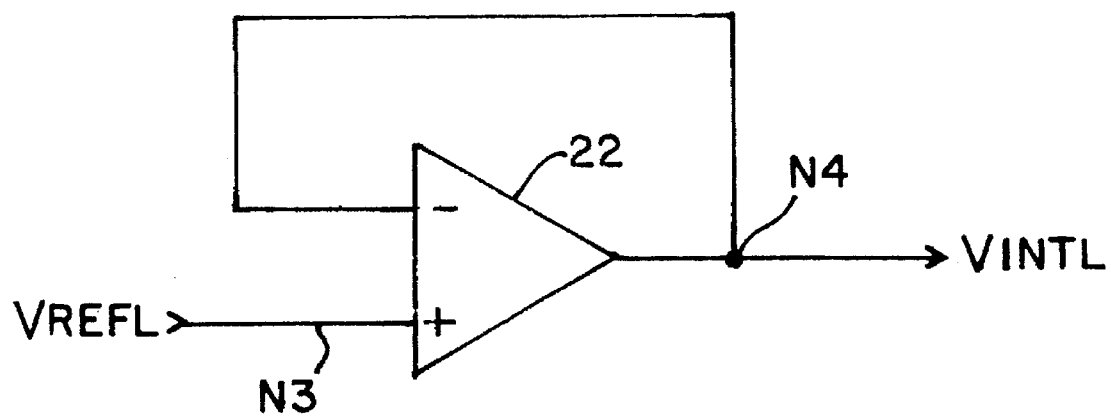

Referring to FIG. 2(a) and 2(b), there is shown a circuit diagram of an internal supply voltage generator for the semiconductor memory device in accordance with the present invention. As shown in this drawing, the internal supply voltage generator employs two voltage followers 21 and 22 and two reference voltages $V_{REF}$ and $V_{REFL}$ to generate two internal supply voltages $V_{INT}$ and $V_{INTL}$. Here, $V_{REF} = V_{INT}$ and $V_{REFL} = V_{INTL}$.

The voltage follower 21 generates the internal supply voltage $V_{INT}$ in response to the reference voltage $V_{REF}$ and the voltage follower 22 generates the internal supply voltage $V_{INTL}$ in response to the reference voltage $V_{REFL}$. Then, the voltage follower 22 applies the generated internal supply voltage $V_{INTL}$ to the sensing driver 12 and a bit line precharge voltage generator which will hereinafter be mentioned in detail. The voltage follower 21 applies the generated internal supply voltage $V_{INT}$ to other circuits. The application of two internal supply voltages $V_{INT}$ and $V_{INTL}$ has the effect of reducing a consumption power amount in the bit line sensing and precharging operations.

Figure 3:
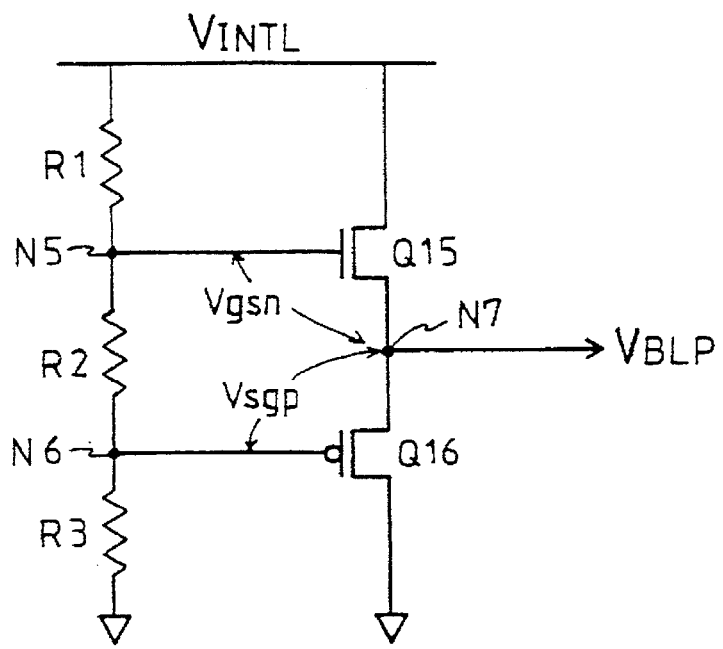
FIG. 3 is a circuit diagram of a bit line precharge voltage generator for the semiconductor memory device in accordance with the present invention.

Referring to FIG. 3, there is shown a circuit diagram of a bit line precharge voltage generator for the semiconductor memory device in accordance with the present invention. As shown in this drawing, the bit line precharge voltage generator includes a resistor R1 connected between the internal supply voltage source $V_{INTL}$ and a node N5, a resistor R2 connected between the node N5 and a node N6, a resistor R3 connected between the node N6 and a ground voltage source Vss, an NMOS transistor Q15 connected between the internal supply voltage source $V_{INTL}$ and a node N7, a PMOS transistor Q16 connected between the node N7 and the ground voltage source Vss, and an output terminal connected to the node N7 for outputting the bit line precharge voltage $V_{BLP}$ to the bit line precharge circuit 15. The NMOS transistor Q15 has its gate connected to the node N5 and the PMOS transistor Q16 has its gate connected to the node N6.

A voltage at the node N5 is the sum of the bit line precharge voltage $V_{BLP}$ and a threshold voltage $V_{Tn}$ of the NMOS transistor Q15. A voltage at the node N6 is obtained by subtracting the absolute value $|V_{Tp}|$ of a threshold voltage of the PMOS transistor Q16 from the bit line precharge voltage $V_{BLP}$. If the bit line precharge voltage $V_{BLP}$ is somewhat lowered in eves, a gate-source voltage Vgsn of the NMOS transistor Q15 is higher than or equal to the threshold voltage $V_{Tn}$ thereof, namely, $Vgsn \geq V_{Tn}$. As a result, the bit line precharge voltage $V_{BLP}$ is charged through the NMOS transistor Q15. On the contrary, in the case where the bit line precharge voltage $V_{BLP}$ is somewhat raised in level, a source-gate voltage Vsgp of the PMOS transistor Q16 is higher than or equal to the absolute value $|V_{Tp}|$ of the threshold voltage thereof, namely, $Vsgp \geq |V_{Tp}|$. As a result, the bit line precharge voltage $V_{BLP}$ is discharged through the PMOS transistor Q16.

Figure 4:
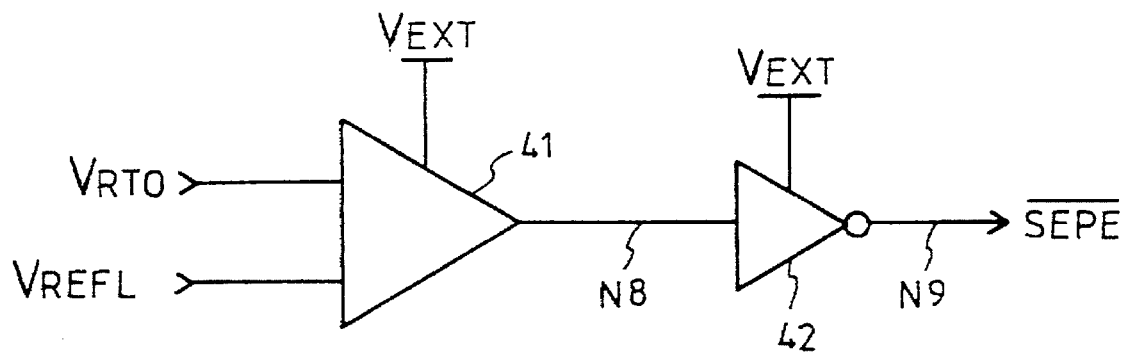
FIG. 4 is a circuit diagram of a sensing driver control signal generator for the semiconductor memory device in accordance with the present invention.

Referring to FIG. 4, there is shown a circuit diagram of a sensing driver control signal generator for the semiconductor memory device in accordance with the present invention. As shown in this drawing, the sensing driver control signal generator includes a comparator 41 for inputting a supply voltage $V_{RTO}$ to PMOS transistor in the bit line sense amplifier 16 in FIG. 1 and the reference voltage $V_{REFL}$, an inverter 42 connected between nodes N8 and N9, and an output terminal connected to the node N9 for outputting the control signal /SEPE.

The control signal /SEPE is applied to the sensing driver 13 in FIG. 1 to control it.

As apparent from the above description, according to the present invention, the data in the memory cell is set to a voltage level lower than that used in the peripheral circuit, resulting in a reduction in power consumption amount in the bit line sensing and precharging operations. Also, a noise bouncing in the chip is significantly reduced so that the semiconductor memory device can stably be operated. Further, the reduction in the cell data voltage level makes it possible to lower the bootstrapped word line level. Therefore, the present invention has the effect of reducing the power consumption amount and noise.

The present invention may be applied to all memory devices with the bit line sensing and precharging operations.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising:

a memory cell array connected to true and complementary bit lines, said memory cell array including a plurality of memory cells, each of said memory cells having a capacitor for storing charge therein and a MOS transistor for transferring the charge from said capacitor to said true bit line or said complementary bit line;

bit line sense amplification means for sensing and amplifying a small voltage difference between said true and complementary bit lines;

control signal generation means for generating first and second control signals;

first pull-up drive means for applying an external supply voltage to said bit line sense amplification means in response to the first control signal from said control signal generation means;

second pull-up drive means for applying an internal supply voltage to said bit line sense amplification means in response to the second control signal from said control signal generation means;

pull-down drive means for discharging a voltage from said bit line sense amplification means;

bit line precharge means for precharging said true and complementary bit lines;

switching means for transferring data on said true and complementary bit lines to true and complementary data bus lines in response to an output signal from a column decoder, respectively; and internal supply voltage generation means for generating the internal supply voltage and applying the generated internal supply voltage to said second pull-up drive means, said internal supply voltage generation means includes first internal supply voltage generation means for generating a first internal supply voltage in response to a first reference voltage, and second internal supply voltage generation means for generating a second internal supply voltage in response to a second reference voltage and applying the generated second internal supply voltage as the internal supply voltage to said second pull-up drive means.

2. A semiconductor memory device as set forth in claim 1, further comprising bit line precharge voltage generation means for generating a bit line precharge voltage and supplying the generated bit line precharge voltage to said bit line precharge means, said bit line precharge voltage generation means including:

first to third resistors connected in series between said second internal supply voltage generation means and a ground voltage source;

an NMOS transistor and a PMOS transistor connected in series between said second internal supply voltage generation means and said ground terminal, said NMOS transistor having its gate connected between said first and second resistors, said PMOS transistor having its gate connected between said second and third resistors; and an output terminal connected between said NMOS transistor and said PMOS transistor to output the bit line precharge voltage to said bit line precharge means.

3. A semiconductor memory device as set forth in claim 2, wherein said second internal supply voltage generation means is adapted to apply the generated second internal supply voltage to said second pull-up drive means and said bit line precharge voltage generation means.

4. A semiconductor memory device as set forth in claim 1, wherein said control signal generation means is adapted to generate the first control signal in response to the second reference voltage and the external supply voltage and to apply the generated first control signal to said first pull-up drive means.

* * * * *